(12) United States Patent
Lee et al.

(10) Patent No.: US 7,564,306 B2
(45) Date of Patent: Jul. 21, 2009

(54) AMPLIFIER WITH COMMON-MODE FEEDBACK CIRCUIT

(75) Inventors: Chao-Cheng Lee, Hsinchu (TW); Chieh-Min Feng, Chu Pei (TW)

(73) Assignee: Realtek Semiconductor Corp., Hsinchu (TW)

(*) Notice: Subject to any disclaimer, the term of this patent is extended or adjusted under 35 U.S.C. 154(b) by 22 days.

(21) Appl. No.: 11/808,869

(22) Filed: Jun. 13, 2007

(65) Prior Publication Data
US 2008/0048778 A1    Feb. 28, 2008

(30) Foreign Application Priority Data
Jun. 16, 2006    (TW) .............................. 95121533 A (51) Int. Cl.
*H03F 3/45* (2006.01)
(52) U.S. Cl. ...................................... 330/258
(58) Field of Classification Search ......... 330/252–261, 330/292
See application file for complete search history.

(56) References Cited

U.S. PATENT DOCUMENTS

| | | | |
|---|---|---|---|
| 5,187,448 A | 2/1993 | Brooks et al. | |
| 6,265,941 B1 | 7/2001 | Lopata | |
| 6,774,722 B2 * | 8/2004 | Hogervorst | 330/258 |
| 6,946,907 B2 | 9/2005 | Tai | |
| 7,358,780 B2 | 4/2008 | Chou | |

FOREIGN PATENT DOCUMENTS

| | | |
|---|---|---|
| TW | 393831 | 6/2000 |
| TW | 200501553 A | 1/2005 |
| TW | 1237442 | 8/2005 |

OTHER PUBLICATIONS

McGraw Hill "Design of Analog CMOS Integrated Circuits", by Razavi, 2001, pp. 314-324.
Gray et al. "Analysis and Design of Analog Integrated Circuits", 4th Ed., 2001, by Wiley, pp. 816-835.

* cited by examiner

*Primary Examiner*—Robert Pascal
*Assistant Examiner*—Khiem D Nguyen
(74) *Attorney, Agent, or Firm*—Muncy, Geissler, Olds & Lowe, PLLC (57) ABSTRACT

A common-mode feedback circuit is provided. An amplifier with a common-mode feedback circuit is compensated by adding a compensating unit so that the amplifier totally has two poles and one zero in its frequency response. Accordingly, the gain of the amplifier is not sacrificed, and both the stability and the phase margin of the circuit are improved.

15 Claims, 8 Drawing Sheets

AMPLIFIER WITH COMMON-MODE FEEDBACK CIRCUIT

BACKGROUND OF THE INVENTION

1. Field of the Invention

The invention relates to an amplifier, and more particularly, to an amplifier with a common-mode feedback (CMFB) circuit.

2. Description of the Related Art

Figure 1:
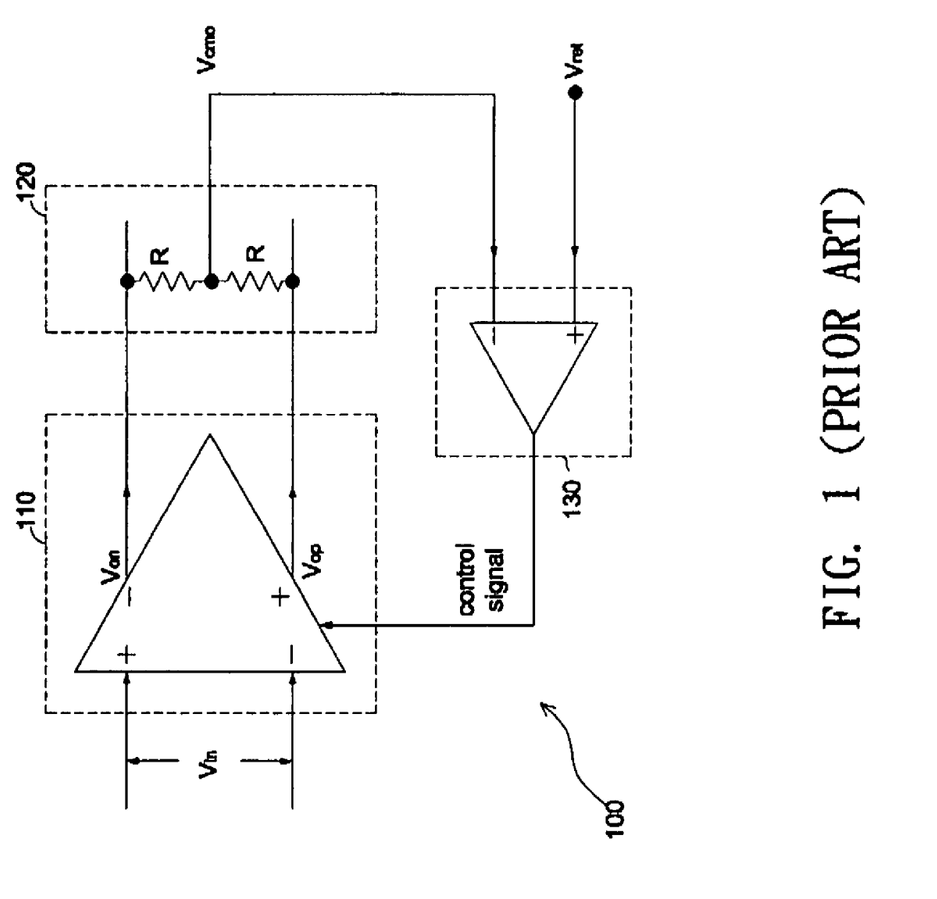
FIG. 1 is a block diagram of a conventional FD Op-Amp with a CMFB circuit.

Regarding a fully differential operational amplifier (FD Op-Amp) with a feedback circuit, the feedback circuit determines only differential output voltages, but does not affect common-mode output voltages. Thus, an additional circuit is required for the FD Op-Amp to control the common-mode output voltage $V_{cmo}$, so that the common-mode output voltage $V_{cmo}$ approaches a reference voltage value (usually halfway between two operating voltages). Referring to FIG. 1, a FD Op-Amp with a common-mode feedback circuit 100 comprises a FD Op-Amp 110, a common-mode detector 120 and a CMFB amplifier 130. Both the common-mode detector 120 and the CMFB amplifier 130 form a common-mode feedback circuit. The configuration and the operation of the common-mode feedback circuit are described on pages 816-835 of a book entitled "Analysis and Design of Analog Integrated Circuits," by Gray et al, 4th Edition, 2001, Wiley, and on pages 314-324 of a book entitled "Design of Analog CMOS Integrated Circuits," by Razavi, 2001, McGraw Hill.

Figure 2:
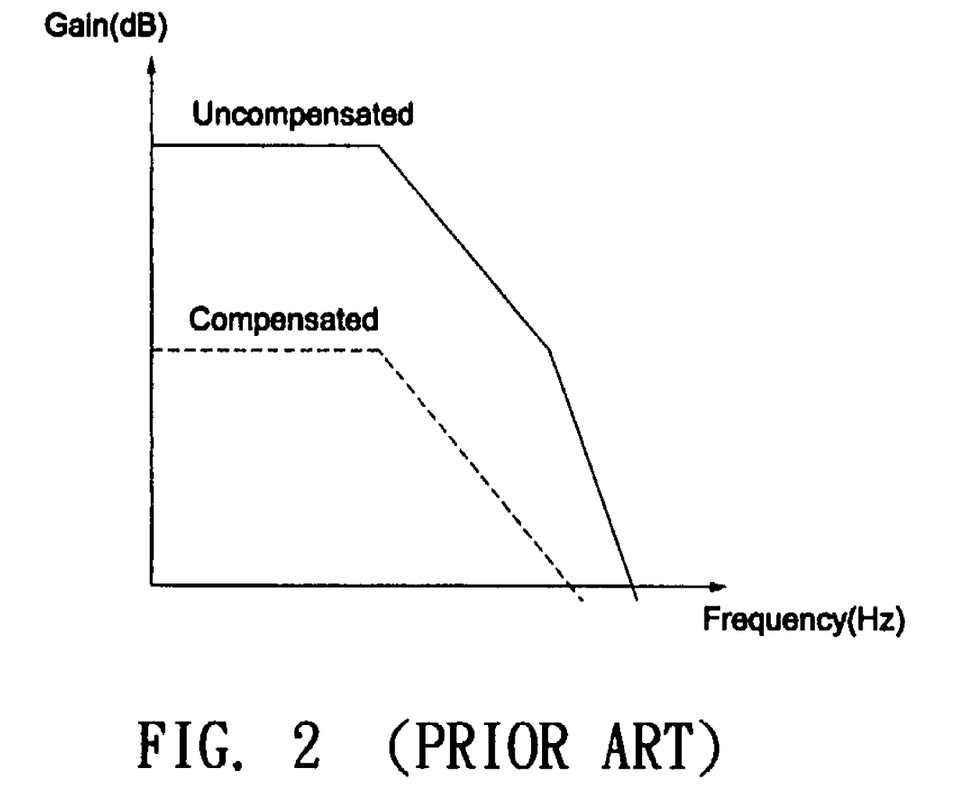
FIG. 2 shows the frequency responses of an uncompensated FD Op-Amp with a CMFB circuit and a compensated FD Op-Amp with a CMFB circuit according to the prior art.

The FD Op-Amp with a CMFB circuit 100 needs to be well compensated; otherwise, a noise injection into the common-mode output voltage $V_{cmo}$ could cause the common-mode output voltage $V_{cmo}$ to ring or oscillate. Usually, the compensation method for amplifier 100 can be classified as source degeneration and current reduction. The source degeneration compensation is to provide a resistor coupled between two transistors at two input terminals of the CMFB amplifier 130, enhancing stability by reducing the gain of the CMFB amplifier 130. The current reduction compensation is to reduce the amount of the control current of the FD Op-Amp 110 to 1/N (N is an integer and N>>1) so as to enhance circuit stability. FIG. 2 shows two frequency responses, one is an uncompensated FD Op-Amp with a CMFB circuit and the other is a compensated FD Op-Amp with a CMFB circuit using above-mentioned compensation method. Referring to FIG. 2, it is obvious that the compensated FD Op-Amp using above-mentioned compensation method sacrifices larger gain and larger bandwidth in order to obtain stability.

SUMMARY OF THE INVENTION

In view of the above-mentioned problems, an object of the invention is to provide a compensating device into the CMFB circuit so as to add an additional pole and an additional zero in the frequency response. And such compensation method can maintain amplifier gain, improves phase margins and enhances circuit stability.

To achieve the above-mentioned object, the amplifier comprise: an operational amplifier having a first output terminal and a second output terminal for amplifying an input signal and generating an output signal; a common-mode detector coupled between the first output terminal and the second output terminal for detecting a common-mode output voltage of the output signal; and, a common-mode feedback amplifier for generating a control signal to the operational amplifier in accordance with a reference voltage, comprising: a first transistor for receiving the common-mode output voltage; a second transistor for receiving the reference voltage; and, a first compensating capacitor for compensating the amplifier.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The amplifier with a CMFB circuit of the invention will be described with reference to the accompanying drawings.

Figure 3:
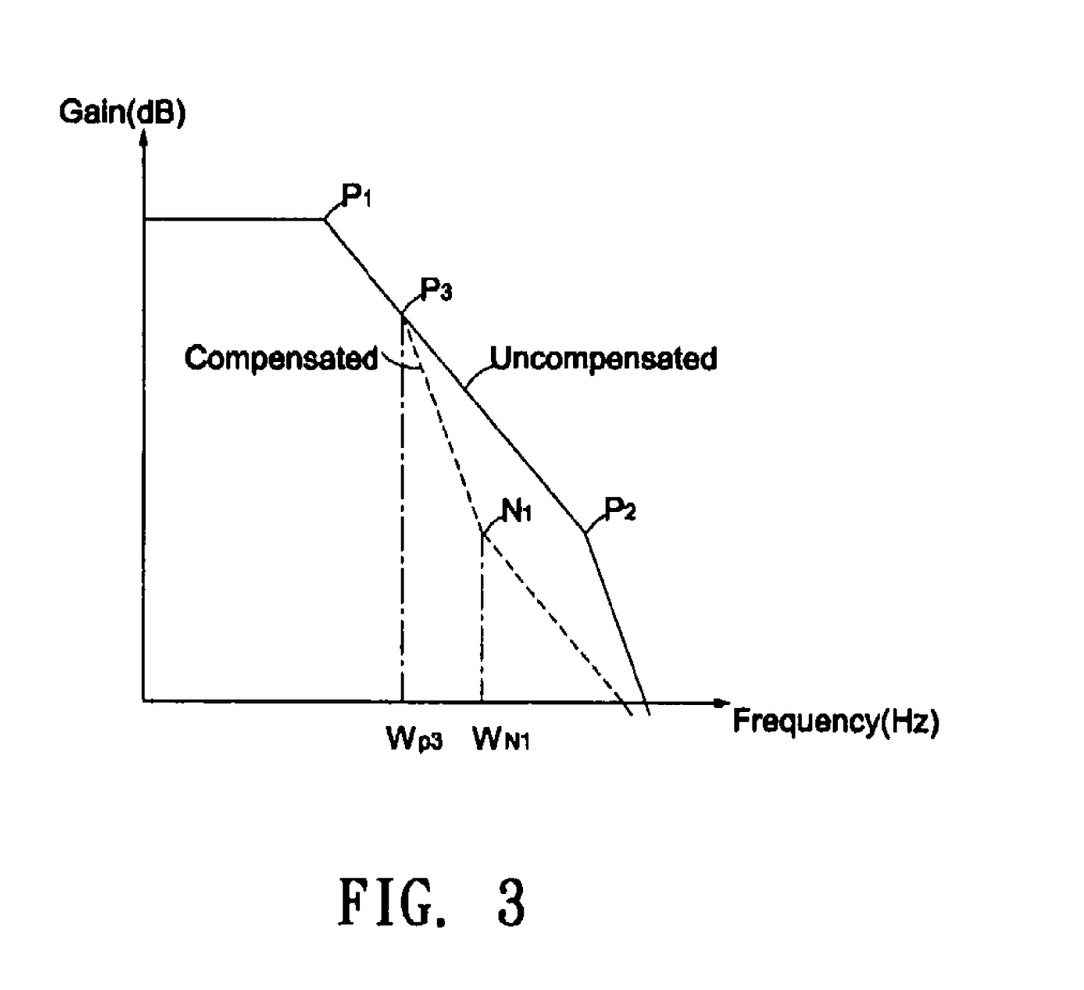
FIG. 3 shows a frequency response of an uncompensated FD Op-Amp with a CMFB circuit and a frequency response of a compensated FD Op-Amp with a CMFB circuit according to the present invention.

FIG. 3 shows a frequency response of an uncompensated FD Op-Amp with a CMFB circuit and a frequency response of a compensated FD Op-Amp with a CMFB circuit according to the present invention. Referring to FIG. 3, originally, an uncompensated FD Op-Amp with a CMFB circuit has two poles $P_1$, $P_2$ in its frequency response. In order to keep the gain, a pole $P_3$ and a zero $N_1$ are introduced to improve phase margins and enhance circuit stability. A total of two poles $P_1$, $P_3$ and one zero $N_1$ are produced in the frequency response, whereas the pole $P_2$ is moved to a higher frequency region (not shown). Thus, the invention adds an additional circuit to create the pole $P_3$ and the zero $N_1$. The additional circuit is implemented with a combination of capacitors and resistors, as will be described in the following five embodiments.

Figure 4:
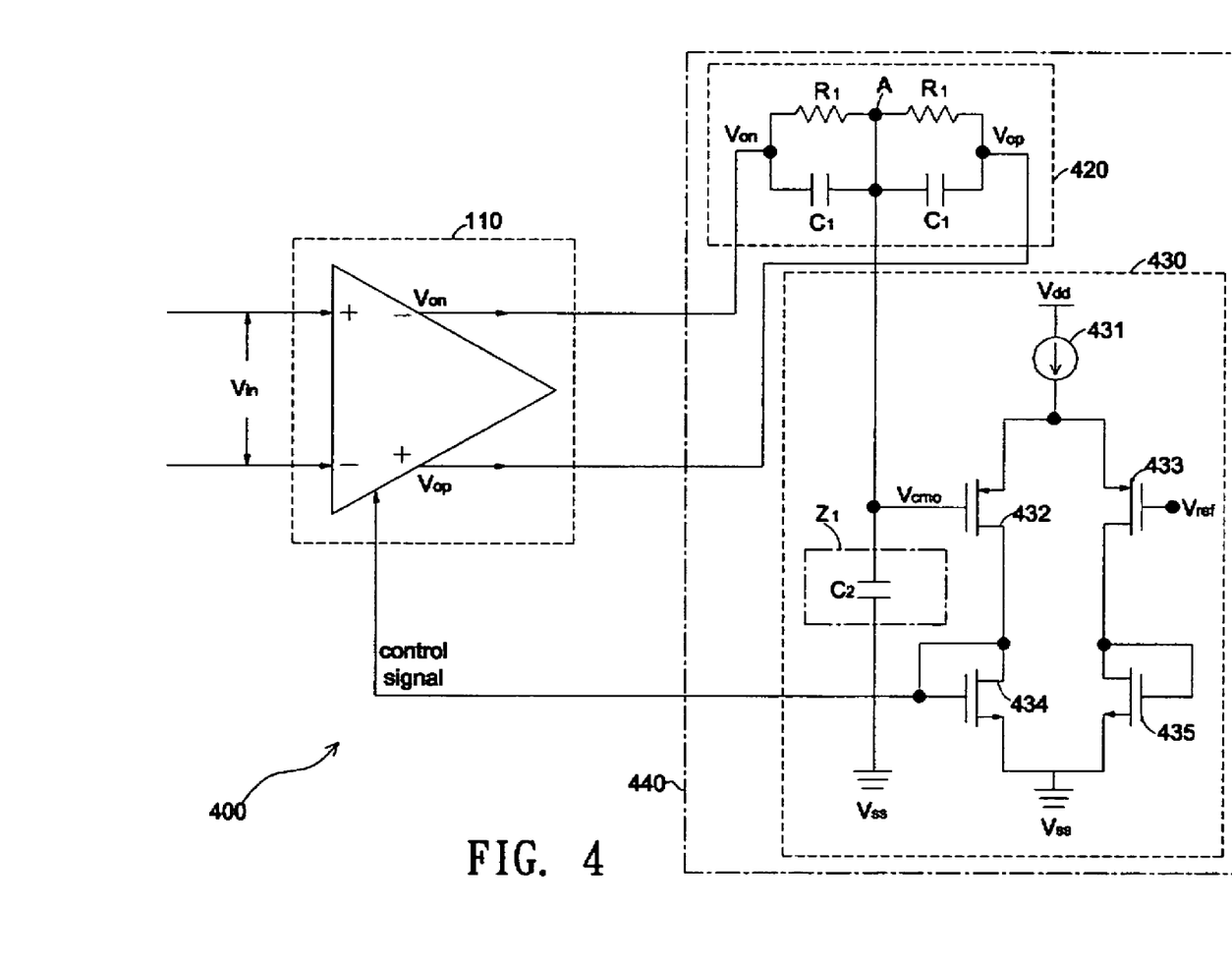
FIG. 4 is a block diagram of an amplifier according to a first embodiment of the present invention.

FIG. 4 is a block diagram of an amplifier according to a first embodiment of the present invention. Referring to FIG. 4, an amplifier 400 comprises a FD Op-Amp 110, a common-mode detector 420, a CMFB amplifier 430 and a compensating unit $Z_1$. Wherein, the common-mode detector 420 and the CMFB amplifier 430 form a CMFB circuit 440 and the FD Op-Amp 110 is a two-stage Op-Amp used to amplify an input signal $V_{in}$ and output a differential signal ($V_{on}-V_{op}$). The common-mode detector 420, including two identical resistors $R_1$ and two identical capacitors $C_1$, is employed to detect a common-mode output voltage ($V_{cmo}=(V_{on}+V_{op})/2$). The CMFB amplifier 430 comprises a current source 431, two PMOS transistors 432, 433 and two NMOS transistors 434, 435. The current source 431 supplies a current to the CMFB amplifier 430. The CMFB amplifier 430 uses the gate of the transistor 433 to receive a reference voltage $V_{ref}$ and uses the gate of the transistor 432 to receive the common-mode output voltage $V_{cmo}$ to generate a control signal (measured at the source of the transistor 432) to the FD Op-Amp 110. The control signal generated by CMFB amplifier 430 is used to modify the CMFB output voltage $V_{cmo}$, to thereby force the CMFB output voltage $V_{cmo}$ and the reference voltage $V_{ref}$ to be equivalent. According to the first embodiment, the compensating unit $Z_1$ is a compensating capacitor $C_2$, coupled between the gate of the transistor 432 and an operating voltage $V_{ss}$, and used to compensate the amplifier 400. After the compensating capacitor $C_2$ is added to the CMFB amplifier 430, a pole $P_3$ and a zero $N_1$ are created in the frequency response of the amplifier 400. The transfer function of the amplifier 400 can be expressed as $$T(s) = \frac{V_{cmo}}{(V_{op}+V_{on})/2} = \frac{\frac{1}{sC_2}}{R_1 // C_1 + \frac{1}{sC_2}} = \frac{\frac{1}{sC_2}}{\frac{R_1}{1+sR_1C_1} + \frac{1}{sC_2}} = \frac{1+sR_1C_1}{1+sR_1(C_1+C_2)},$$

where a zero frequency is $$\omega_{N1} = \frac{1}{R_1 C_1}$$

and a pole frequency is $$\omega_{p3} = \frac{1}{R_1(C_1+C_2)}.$$

According to the transfer function T(s), modifying the capacitance value of the compensating capacitor $C_2$ can cause the zero frequency $\omega_{N1}$ to be several times higher than the pole frequency $\omega_{P3}$. As the capacitance value of the compensating capacitor $C_2$ increases, the phase margin also increases, resulting in a more stable amplifier 400. In one embodiment, capacitor $C_2$ can be designed larger than capacitor $C_1$. Note that both the zero $N_1$ and the pole $P_3$ are required to be located well below the unit gain frequency according to the uncompensated frequency response.

Figure 5:
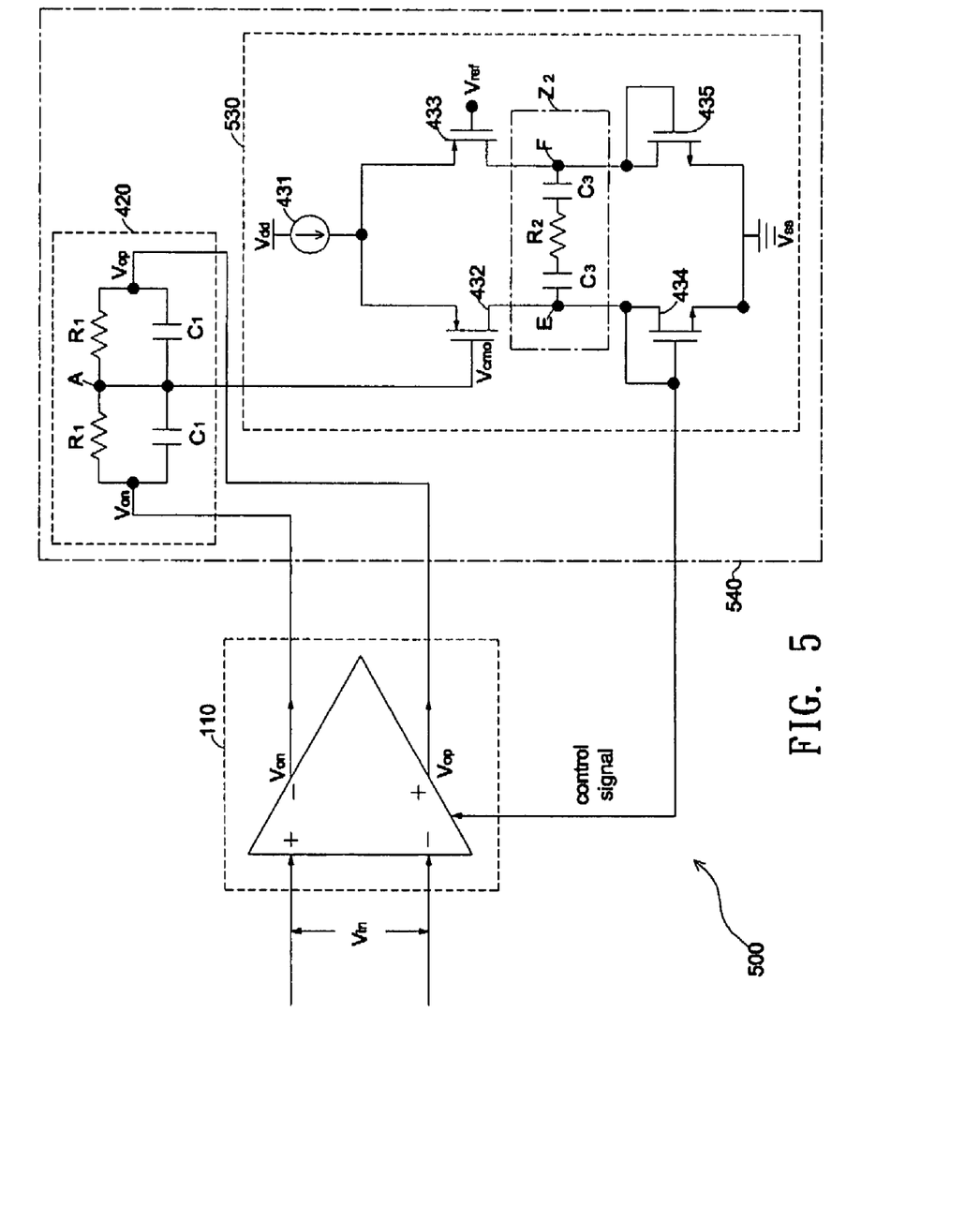
FIG. 5 is a block diagram of an amplifier according to a second embodiment of the present invention.

FIG. 5 is a block diagram of an amplifier according to a second embodiment of the present invention. Referring to FIG. 5, compared with the first embodiment, a CMFB amplifier 530 in the second embodiment additionally includes a compensating unit $Z_2$ coupled between two nodes E, F of the CMFB amplifier 530 to compensate the amplifier 500. The compensating unit $Z_2$ comprises two identical capacitors $C_3$ and a compensating resistor $R_2$. The gain of the amplifier 500 is $A_{V1}=g_m r_0$, where $g_m$, $r_0$ are the conductance of the PMOS transistor 432 and the output resistor of the NMOS transistor 434, respectively. After the compensating unit $Z_2$ is added, the gain of the amplifier 500 is $$A_{V2} = g_m(r_0 // Z_2) = g_m\left(r_0 // \left(\frac{1}{sC_3}+R_2\right)\right) = g_m \frac{sR_2C_3 r_0 + r_0}{s(R_2C_3+r_0C_3)+1},$$

where the zero frequency is $$\omega_{N1} = \frac{1}{R_2C_3}$$

and the pole frequency is $$\omega_{P3} = \frac{1}{C_3(R_2+r_0)}.$$

Thus, after the compensating unit $Z_2$ is added to the CMFB amplifier 530, the compensated frequency response maintains the same gain as the uncompensated frequency response does (as shown in FIG. 3); moreover, an additional pole and an additional zero are introduced, making the phase margin of the compensated amplifier 500 more ideal than that of a uncompensated amplifier. In addition, according to the gain $A_{V2}$, modifying the ratio of the compensating resistor $R_2$ to the compensating resistor $r_0$ can cause the zero frequency $\omega_{N1}$ to be several times higher than the pole frequency $\omega_{P3}$. As the resistance value of the compensating resistor $r_0$ increases, the phase margin also increases, resulting in a more stable amplifier 500.

Figure 6:
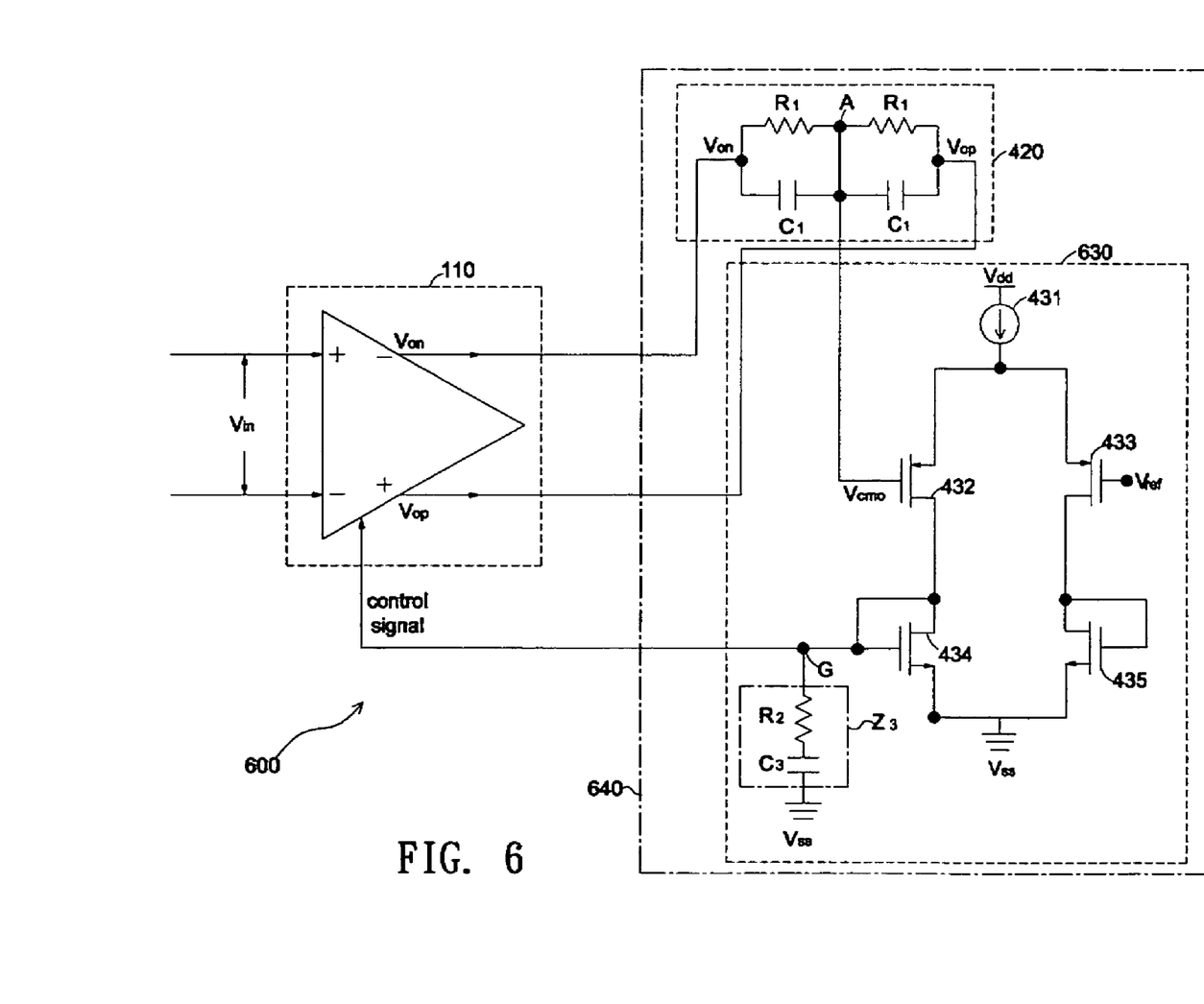
FIG. 6 is a block diagram of an amplifier according to a third embodiment of the present invention.

FIG. 6 is a block diagram of an amplifier according to a third embodiment of the present invention. Referring to FIG. 6, compared with two above-mentioned embodiments, a CMFB amplifier 630 in the third embodiment additionally includes a compensating unit $Z_3$, coupled between a node G and the ground voltage $V_{ss}$, to compensate the amplifier 600. The compensating unit $Z_3$ comprises a compensating capacitor $C_3$ and a compensating resistor $R_2$. The compensating resistor $R_2$ is respectively coupled between a terminal of the compensating capacitor $C_3$ and the drain of the transistor 432 while the other terminal of the compensating capacitor $C_3$ is coupled to the ground voltage $V_{ss}$. It should be noted that a differential compensating unit $Z_2$ is employed in the CMFB amplifier 530 to achieve the goal of additionally creating both the zero $N_1$ and the pole $P_3$, whereas a single-ended compensating unit $Z_3$ is employed in the CMFB amplifier 630 to achieve the same goal. Since the gain $A_{V2}$ derived from the amplifier 500 is the same as that derived from the amplifier 600, the description is omitted herein.

Figure 7:
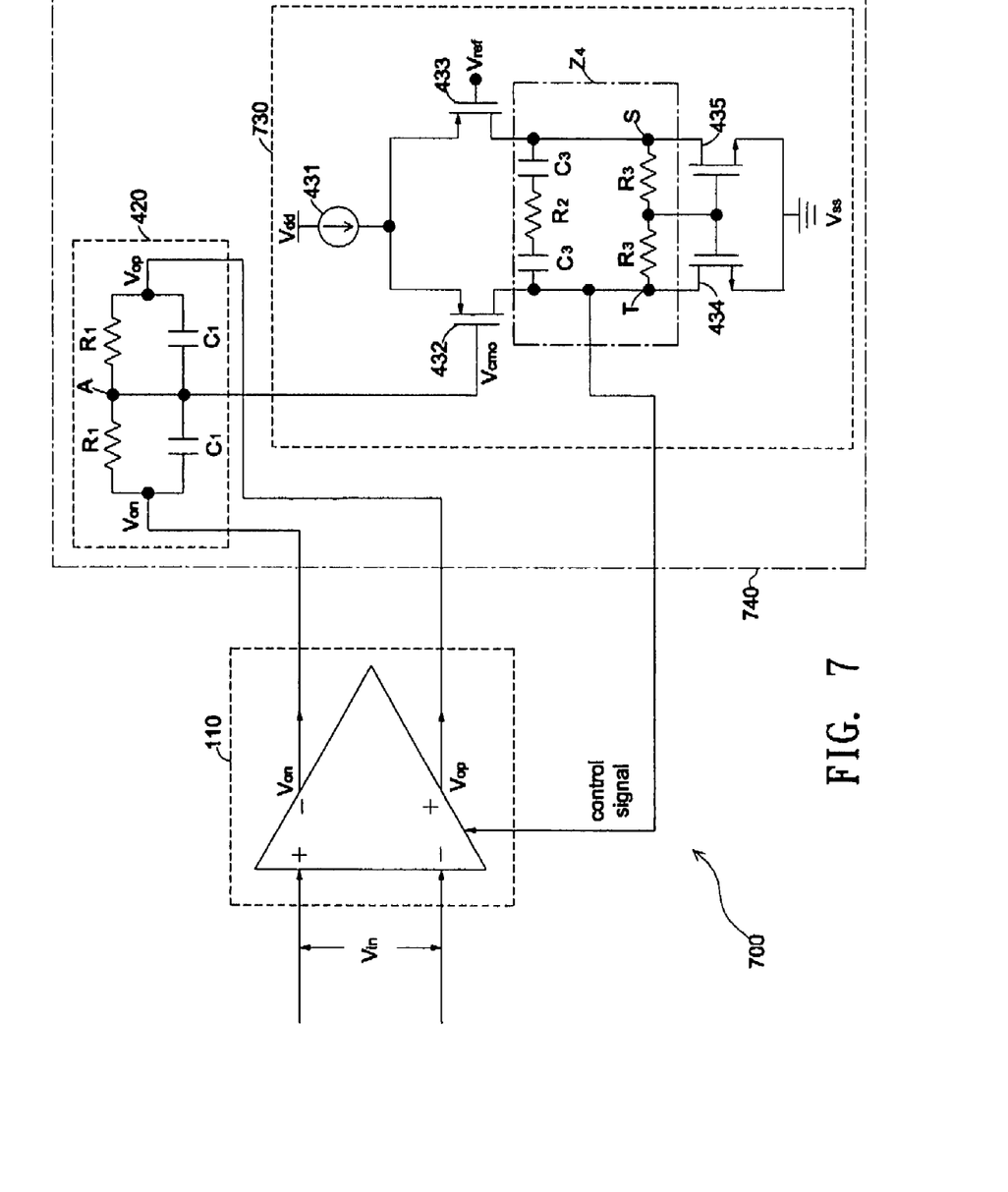
FIG. 7 is a block diagram of an amplifier according to a fourth embodiment of the present invention.

FIG. 7 is a block diagram of an amplifier according to a fourth embodiment of the present invention. Referring to FIG. 7, compared with the above-mentioned embodiments, a CMFB amplifier 730 in the fourth embodiment additionally includes a compensating unit $Z_4$, coupled between two nodes T, S (at the drains of the transistors 432, 433), to compensate the amplifier 700; moreover, the connectivity between transistors 434, 435 is quite different. The compensating unit $Z_4$ comprises a compensating capacitor $C_3$, a compensating resistor $R_2$ and two identical compensating resistors $R_3$. One of two identical compensating resistors $R_3$ is coupled between the drain and the gate of the NMOS transistor 434 while the other is coupled between the drain and the gate of the NMOS transistor 435.

After the compensating unit $Z_4$ is added, the gain of the amplifier 700 can be derived as follows.

$$A_{V3} = g_m(r_0 // Z_4) = g_m\left(r_0 // \left(\frac{1}{sC_3} + R_2\right) // R3\right)$$

$$\text{For } R_3 << r_0, A_{V3} = g_m \frac{sR_2C_3R_3 + R_3}{sR_2C_3 + sR_3C_3 + 1},$$

where the zero frequency is $$\omega_{N1} = \frac{1}{R_2C_3}$$

and the pole frequency is $$\omega_{p3} = \frac{1}{C_3(R_2 + R_3)}.$$

According to the gain $A_{V3}$, modifying the ratio of the compensating resistor $R_2$ to the compensating resistor $R_3$ can cause the zero frequency $\omega_{N1}$ to be several times higher than the pole frequency $\omega_{P3}$. As the resistance value of the compensating resistor $R_3$ increases, the phase margin also increases, resulting in a more stable amplifier 700. Comparing two gains $A_{V2}$, $A_{V3}$, the resistor $r_0$ in the CMFB amplifier 430 is not a real resistor, and its resistance value must be obtained by program simulation. By contrast, the compensating resistor $R_3$ in the CMFB amplifier 430 has a specified resistance value. Now assume that $R_3 << r_0$. the added compensating resistor $R_3$ is used in substitution for the resistor $r_0$ upon deriving the gain $A_{V3}$.

Figure 8:
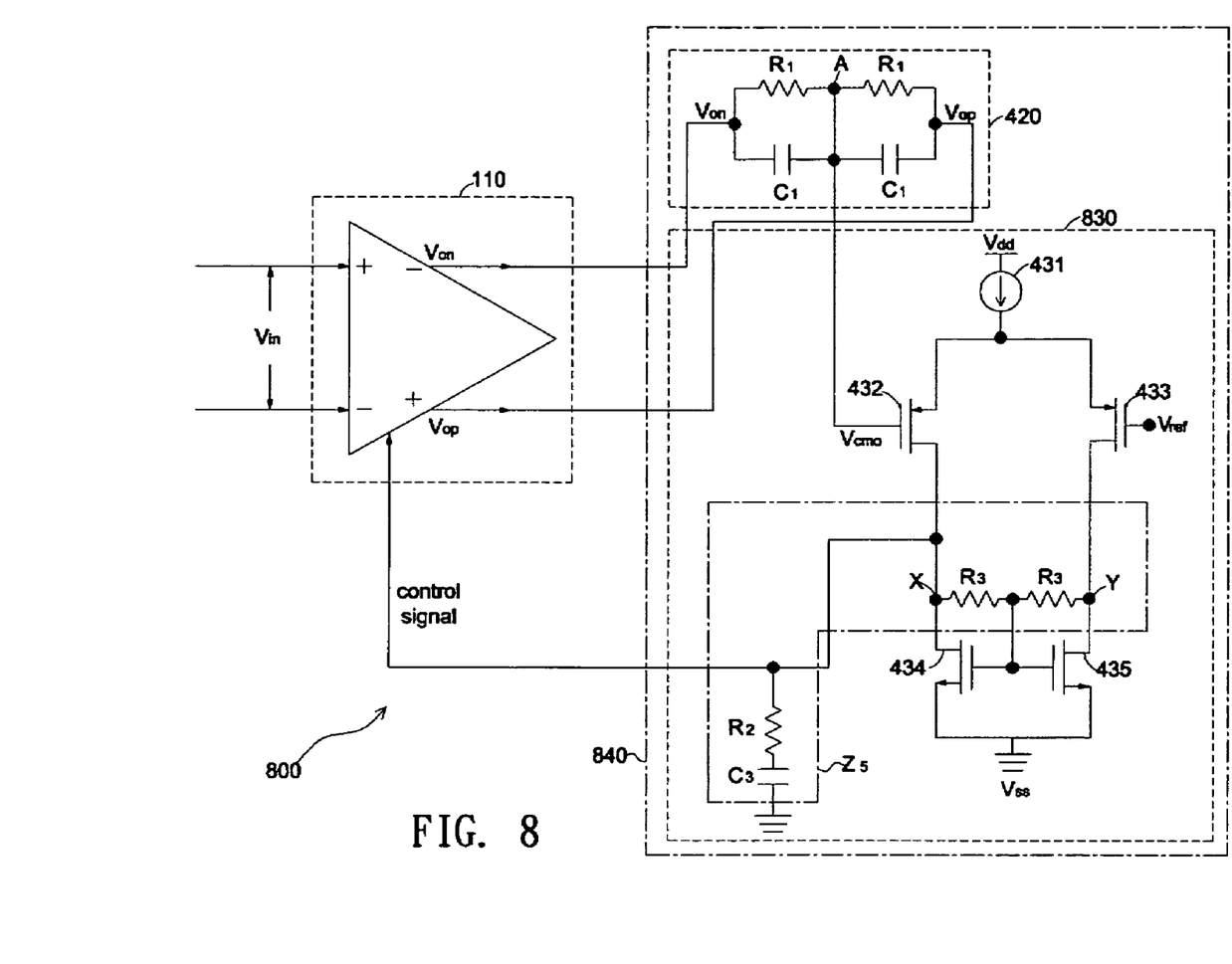
FIG. 8 is a block diagram of an amplifier according to a fifth embodiment of the present invention.

FIG. 8 is a block diagram of an amplifier according to a fifth embodiment of the present invention. Referring to FIG. 8, compared with the above-mentioned embodiments, a CMFB amplifier 830 in the fifth embodiment additionally includes a compensating unit $Z_5$, coupled between two nodes X, Y and the ground voltage $V_{ss}$, to compensate the amplifier 800. The compensating unit $Z_5$ comprises a compensating capacitor $C_3$, a compensating resistor $R_2$ and two identical compensating resistors $R_3$. In this embodiment, the connectivity between the compensating capacitor $C_3$ and the compensating resistor $R_2$ is the same as that shown in FIG. 6 while the connectivity between two identical compensating resistors $R_3$ is the same as that shown in FIG. 7. Since the gain $A_{V3}$ derived from the amplifier 800 is the same as that derived from the amplifier 700, the description is omitted herein.

The invention is not limited to the use of MOSFETs as described in the above-mentioned embodiments. In practical applications, a PMOS differential amplifier, including two PMOS transistor 432, 433 in the CMFB amplifier 430, 530, 630, 730, 830, can be substituted by two PNP bipolar junction transistors (BJT). Likewise, two NMOS transistor 434, 435 can be substituted by two NPN BJTs. If all transistors in the CMFB amplifier are implemented with BJTs, all transistors in the FD Op-Amp 110 should be implemented with BJTs as well. Besides, since the CMFB circuit 440 is used to force the output common-mode voltage (the node A in each embodiment) to equal the reference voltage $V_{ref}$ substantially, related methods to generate the reference voltage $V_{ref}$, such as using a reference voltage $V_{ref}$ generator or a voltage division, are also within the scope of the invention.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An amplifier, comprising:
   an operational amplifier having a first output terminal and a second output terminal for amplifying an input signal and generating an output signal;
   a common-mode detector coupled between the first output terminal and the second output terminal for detecting a common-mode output voltage of the output signal; and
   a common-mode feedback amplifier, coupled to the common-mode detector, for generating a control signal to the operational amplifier in accordance with the common-mode output voltage and a reference voltage, comprising:
   a first transistor for receiving the common-mode output voltage;
   a second transistor for receiving the reference voltage;
   a first compensating capacitor for compensating the amplifier; and
   a first compensating resistor for compensating the amplifier.

2. The amplifier according to claim 1, wherein the common-mode detector comprises:
   a first resistor coupled to the first output terminal;
   a second resistor coupled between the second output terminal and the first resistor;
   a first capacitor coupled to the first output terminal; and
   a second capacitor coupled between the second output terminal and the first capacitor;
   wherein resistance values of the first resistor and the second resistor are substantially equivalent and capacitance values of the first capacitor and the second capacitor are substantially equivalent.

3. The amplifier according to claim 1, wherein the first compensating resistor is coupled to a drain of the first transistor and the first compensating capacitor is coupled between the first compensating resistor and an operating voltage.

4. The amplifier according to claim 1, wherein the common-mode feedback amplifier further comprises:
   a second compensating capacitor for compensating the amplifier;
   wherein the first compensating resistor is coupled between the first compensating capacitor and the second compensating capacitor, and the first compensating capacitor and the second compensating capacitor are respectively coupled to drains of the first resistor and the second resistor, and wherein capacitance values of the first capacitor and the second capacitor are substantially equivalent.

5. The amplifier according to claim 4, wherein the common-mode feedback amplifier further comprises:
   a second compensating resistor coupled to the drain of the first transistor; and
   a third compensating resistor coupled between the drain of the second transistor and the second compensating resistor;
   wherein resistance values of the second resistor and the third resistor are substantially equivalent.

6. The amplifier according to claim 3, wherein the common-mode feedback amplifier further comprises:
   a second compensating resistor coupled to the drain of the first transistor; and a third compensating resistor coupled between the drain of the second transistor and the second compensating resistor;

wherein resistance values of the second resistor and the third resistor are substantially equivalent.

7. The amplifier according to claim 1, wherein the common-mode feedback amplifier further comprises:

a first current source coupled to both the first transistor and the second transistor for providing a current to the common-mode feedback amplifier.

8. The amplifier according to claim 1, wherein the common-mode output voltage is substantially equivalent to the reference voltage.

9. The amplifier according to claim 1, wherein the operational amplifier is a fully differential operational amplifier.

10. The amplifier according to claim 1, wherein the output signal is a differential signal.

11. The amplifier according to claim 1, wherein the first transistor and the second transistor are metal-oxide-semiconductor (MOS) transistors.

12. The amplifier according to claim 1, wherein the first transistor and the second transistor are bipolar junction transistors (BJTs).

13. The amplifier according to claim 1, wherein the reference voltage is generated by a reference voltage generator.

14. The amplifier according to claim 1, wherein the reference voltage is generated according to a voltage division.

15. The amplifier according to claim 1, wherein the amplifier has two poles and one zero in frequency response.

* * * * *